(12) United States Patent
Chen et al.

(10) Patent No.: US 8,406,045 B1
(45) Date of Patent: Mar. 26, 2013

(54) THREE TERMINAL MAGNETIC ELEMENT

(75) Inventors: Eugene Youjun Chen, Fremont, CA (US); Dmytro Apalkov, San Jose, CA (US)

(73) Assignee: Grandis Inc., Milpitas, CA (US)

( * ) Notice: Subject to any disclaimer, the term of this patent is extended or adjusted under 35 U.S.C. 154(b) by 217 days.

(21) Appl. No.: 13/009,818

(22) Filed: Jan. 19, 2011

(51) Int. Cl.
*G11C 11/16* (2006.01)
(52) U.S. Cl. .......... 365/173; 365/158; 365/171
(58) Field of Classification Search .......... 365/55, 365/66, 97
See application file for complete search history.

(56) References Cited

U.S. PATENT DOCUMENTS

| | | | |
|---|---|---|---|
| 5,695,864 A | 12/1997 | Slonczewski | |
| 6,714,445 B2 | 3/2004 | Farrar | |
| 6,917,088 B2 | 7/2005 | Takahashi et al. | |
| 7,009,877 B1 | 3/2006 | Huai et al. | |
| 7,486,552 B2 * | 2/2009 | Apalkov et al. | 365/173 |
| 7,764,539 B2 | 7/2010 | Guo et al. | |
| 7,781,231 B2 | 8/2010 | Li | |
| 7,936,598 B2 * | 5/2011 | Zheng et al. | 365/173 |
| 8,023,316 B2 * | 9/2011 | Zheng et al. | 365/158 |
| 8,054,677 B2 * | 11/2011 | Zhu | 365/158 |
| 8,102,703 B2 * | 1/2012 | Nozieres et al. | 365/173 |

OTHER PUBLICATIONS

Braganca, Patrick et al., "A Three-Terminal Approach to Developing Spin-Torgue Written Magnetic Random Access Memory Cells", IEEE Transactions on Nanotechnology, Mar. 2009, pp. 190-195, vol. 8.

* cited by examiner

*Primary Examiner* — Tan T. Nguyen
(74) *Attorney, Agent, or Firm* — Renaissance IP Law Group LLP

(57) ABSTRACT

Techniques and magnetic devices associated with a magnetic element are described that includes a presetting fixed layer having a presetting fixed layer magnetization, a free layer having a changeable free layer magnetization, and a fixed layer having a fixed layer magnetization, where a presetting current pulse applied between the presetting fixed layer and free layer operates to preset the free layer magnetization in advance of a write pulse. Techniques and magnetic devices associated with a magnetic element are described that includes a first terminal, a first magnetic tunnel junction, a second terminal, a second magnetic tunnel junction, and a third terminal, where a current pulse applied between the first and second terminal operate to switch the state of the first magnetic tunnel junction and a current applied between the second and third terminal operate to switch the state of the second magnetic tunnel junction.

14 Claims, 9 Drawing Sheets

THREE TERMINAL MAGNETIC ELEMENT

GOVERNMENT FUNDING

This invention was made with U.S. Government support under Grant/Contract No. HR0011-09-C-0023 awarded by DARPA. The U.S. Government retains certain rights in this invention.

BACKGROUND

This document relates to three terminal magnetic structures having at least one free ferromagnetic layer.

Various magnetic devices use multilayer structures which have at least one ferromagnetic layer configured as a "free" layer whose magnetic direction can be changed by an external magnetic field or a control current. Magnetic memory devices may be constructed using such multilayer structures where information is stored based on the magnetic direction of the free layer.

One example for such a multilayer structure is a spin valve (SV) which includes at least three layers: two ferromagnetic layers and a conducting layer between the two ferromagnetic layers. Another example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer functions as a tunnel barrier between the two ferromagnetic layers. When the thickness of the insulator is sufficiently thin, e.g., a few nanometers or less, electrons in the two ferromagnetic layers can tunnel or "penetrate" through the thin layer of the insulator due to a tunneling effect under a bias voltage applied to the two ferromagnetic layers across the barrier layer.

Notably, the resistance to the electrical current across the MTJ or SV structures varies with the relative direction of the magnetizations in the two ferromagnetic layers. When the magnetizations of the two ferromagnetic layers are parallel to each other, the resistance across the MTJ or SV structures is at a minimum value RP. When the magnetizations of the two ferromagnetic layers are anti-parallel with each other, the resistance across the MTJ or SV is at a maximum value RAP. The magnitude of this effect is commonly characterized by the tunneling magnetoresistance (TMR) in MTJs or magnetoresistance (MR) in SVs defined as $(R_{AP}-R_P)/R_P$.

SUMMARY

This document discloses techniques, devices and systems that use three terminal magnetic elements.

This document discloses techniques, devices and systems that use magnetic elements that include at least a presetting fixed layer having a fixed layer magnetization fixed in a direction substantially perpendicular to the plane of presetting fixed layer; a fixed layer having a fixed layer magnetization fixed in a direction substantially in the plane of the fixed layer; a free layer between the presetting fixed layer and fixed layer having a free layer magnetization with in-plane anisotropy; a first nonmagnetic spacer layer between the presetting fixed layer and the free layer; a second nonmagnetic spacer layer between the free layer and the fixed layer; and circuitry configured to apply a presetting current pulse and a write current pulse during a write operation, wherein: the presetting current pulse includes a current between the presetting fixed layer and free layer that presets the magnetization of the free layer magnetization at some angle away from the easy axis direction utilizing a spin transfer torque, the write current pulse includes a current between the free layer and fixed layer that reverses the direction of the magnetization of the free layer utilizing a spin transfer torque, and the write current pulse is applied sequentially after the beginning of the presetting current pulse and before the magnetization of the free layer relaxes back to be substantially parallel with the anisotropy of the free layer.

This document further discloses techniques, devices and systems that use magnetic elements that include at least a presetting fixed layer having a fixed layer magnetization fixed in a direction substantially perpendicular to the plane of presetting fixed layer; a fixed layer having a fixed layer magnetization fixed in a direction substantially in the plane of the fixed layer; a free layer having a free layer magnetization with in-plane anisotropy; a nonmagnetic spacer layer between the presetting fixed layer and the free layer and between the fixed layer and the free layer wherein the fixed layer and presetting fixed layer are laterally separated; and circuitry configured to apply a presetting current pulse and a write current pulse during a write operation, wherein: the presetting current pulse includes a current between the presetting fixed layer and free layer that presets the magnetization of the free layer magnetization at some angle away from the easy axis direction utilizing a spin transfer torque, the write current pulse includes a current between the free layer and fixed layer that reverses the direction of the magnetization of the free layer utilizing a spin transfer torque, and the write current pulse is applied sequentially after the beginning of the presetting current pulse and before the magnetization of the free layer relaxes back to be substantially parallel with the anisotropy of the free layer.

This document further discloses techniques, devices and systems that use magnetic elements that include at least a presetting fixed layer having a fixed layer magnetization fixed in a direction substantially in the plane of presetting fixed layer; a fixed layer having a fixed layer magnetization fixed substantially in a direction perpendicular to the plane of the fixed layer; a free layer between the presetting fixed layer and fixed layer having a free layer magnetization with an out of plane anisotropy, which overcomes demagnetizing energy; a first nonmagnetic spacer layer between the presetting fixed layer and the free layer; a second nonmagnetic spacer layer between the free layer and the fixed layer; and circuitry configured to apply a presetting current pulse and a write current pulse during a write operation, wherein: the presetting current pulse includes a current between the presetting fixed layer and free layer that presets the magnetization of the free layer magnetization partially in-plane utilizing a spin transfer torque, the write current pulse includes a current between the free layer and fixed layer that reverses the direction of the magnetization of the free layer utilizing a spin transfer torque, and the write current pulse is applied sequentially after the beginning of the presetting current pulse and before the magnetization of the free layer relaxes back to be substantially parallel with the anisotropy easy axis of the free layer.

This document further discloses techniques, devices and systems that use magnetic elements that include at least a presetting fixed layer having a fixed layer magnetization fixed substantially in a direction in the plane of presetting fixed layer; a fixed layer having a fixed layer magnetization fixed substantially in a direction perpendicular to the plane of the fixed layer; a free layer having a free layer magnetization with an out of plane anisotropy, which overcomes demagnetizing energy; a nonmagnetic spacer layer between the presetting fixed layer and the free layer and between the fixed layer and the free layer wherein the fixed layer and presetting fixed layer are laterally separated; and circuitry configured to apply a presetting current pulse and a write current pulse during a write operation, wherein: the presetting current pulse includes a current between the presetting fixed layer and free layer that presets the magnetization of the free layer magnetization partially in-plane utilizing a spin transfer torque, the write current pulse includes a current between the free layer and fixed layer that reverses the direction of the magnetization of the free layer utilizing a spin transfer torque, and the write current pulse is applied sequentially after the beginning of the presetting current pulse and before the magnetization of the free layer relaxes back to be substantially parallel with the anisotropy easy axis of the free layer.

This document further discloses techniques, devices and systems that use magnetic elements that include at least a first contact; a first magnetic tunnel junction; a second contact; a second magnetic tunnel junction; and a third contact; wherein the first magnetic tunnel junction is disposed between the first contact and second contact, the second contact is disposed between the first magnetic tunnel junction and second magnetic tunnel junction, and the second magnetic tunnel junction is disposed between the second contact and third contact; and circuitry configured to apply a first write current pulse and second write current pulse, wherein: the first write current pulse includes a current between the first contact and second contact that reverses the state of the first magnetic tunnel junction utilizing a spin transfer torque; and the second write current pulse includes a current between the second contact and third contact that reverses the state of the first magnetic tunnel junction utilizing a spin transfer torque.

In certain implementations, the use of three terminal magnetic elements may act to reduce the current pulse required to reverses the direction of the magnetization of the free layer utilizing a spin transfer torque, thus leading to lower power densities. In certain implementations, the use of three terminal magnetic elements may allow greater device densities.

These and other implementations are described in greater detail in the drawings, the description and the claims.

DETAILED DESCRIPTION

Figure 1A:
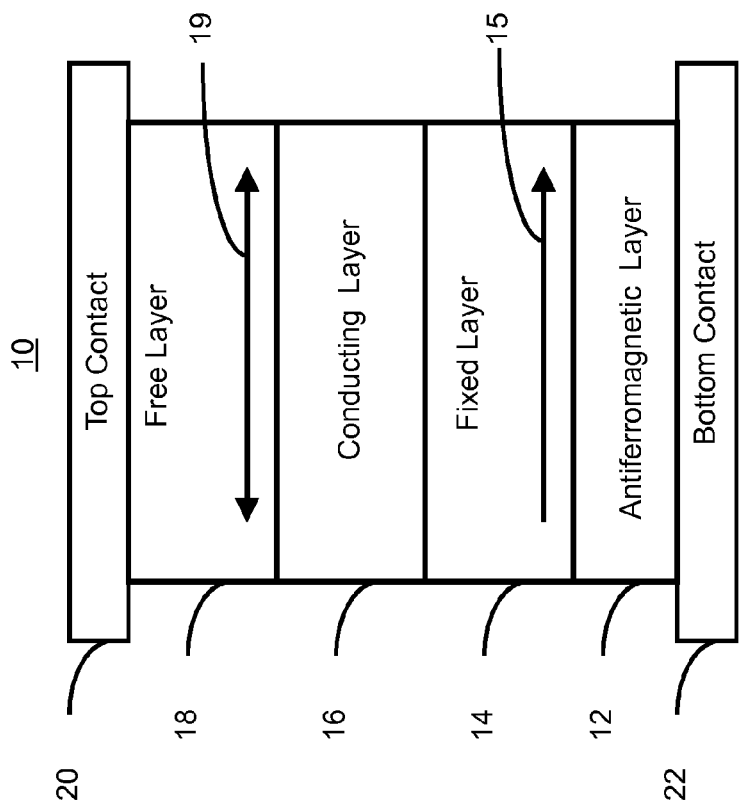
FIG. 1A shows an example of a magnetic element in the form a spin valve.
Figure 1B:
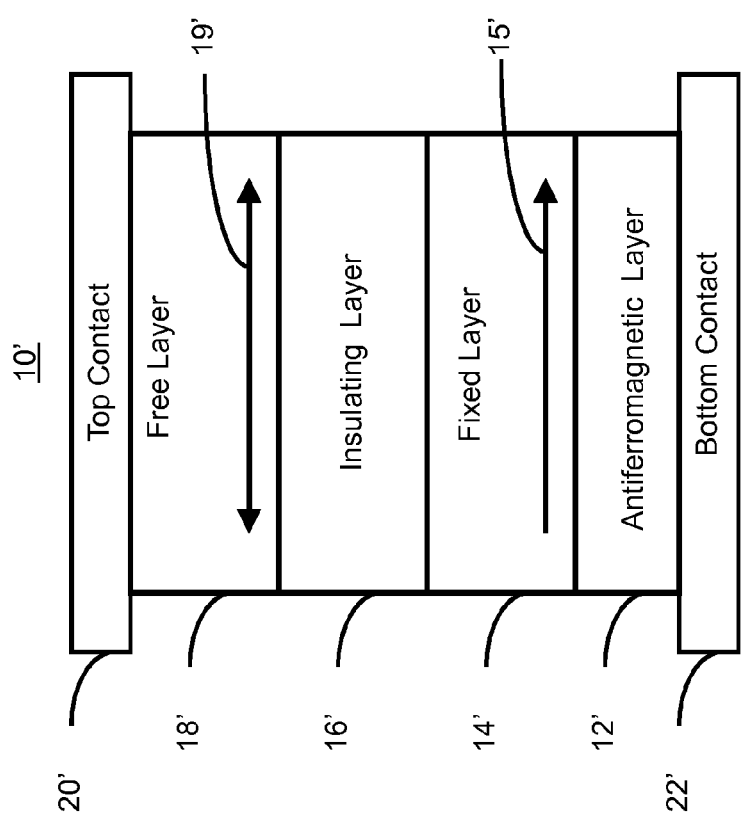
FIG. 1B shows an example of a magnetic element in the form of a spin tunneling junction.

FIGS. 1A and 1B depict exemplary magnetic elements 10 and 10'. The magnetic element 10 is a spin valve and includes an antiferromagnetic (AFM) layer 12, a fixed layer 14, a conductive spacer layer 16 and a free layer 18. Other layers, such as seed or capping layer can also be used. The fixed layer 14 and the free layer 18 are ferromagnetic. The free layer 18 is depicted as having a changeable magnetization 19. The magnetization of the free layer 18 is free to rotate, in response to an external magnetic field, a driving electric current, or a combination of both. The conductive spacer layer 16 is nonmagnetic. The AFM layer 12 is used to pin the magnetization of the fixed layer 14 in a particular direction. After post annealing, the ferromagnetic layer 14 is pinned with a fixed magnetization 15. Also depicted are top contact 20 and bottom contact 22 that can be used to drive current through the magnetic element 10.

The magnetic element 10' depicted in FIG. 1B is a magnetic tunneling junction. The magnetic element 10' includes an AFM layer 12', a fixed layer 14' having a fixed layer magnetization 15', an insulating barrier layer 16', a free layer 18' having a changeable magnetization 19'. The barrier layer 16' is thin enough for electrons to tunnel through in a magnetic tunneling junction 10'.

The relationship between the resistance to the current flowing across the MTJ or SV and the relative magnetic direction between the two ferromagnetic layers in the TMR or MR effect can be used for nonvolatile magnetic memory devices to store information in the magnetic state of the magnetic element. Magnetic random access memory (MRAM) devices based on the TMR or MR effect, for example, can be an alternative of and compete with electronic RAM devices. In such devices, one ferromagnetic layer is configured to have a fixed magnetic direction and the other ferromagnetic layer is a "free" layer whose magnetic direction can be changed to be either parallel or opposite to the fixed direction and thus operate as a recording layer. Information is stored based on the relative magnetic direction of the two ferromagnetic layers on two sides of the barrier of the MTJ or SV. For example, binary bits "1" and "0" can be recorded as the parallel and anti-parallel orientations of the two ferromagnetic layers in the MTJ or SV. Recording or writing a bit in the MTJ or SV can be achieved by switching the magnetization direction of the free layer, e.g., by a writing magnetic field generated by supplying currents to write lines disposed in a cross stripe shape, by a current flowing across the MTJ or SV based on the spin transfer effect, by a combination of applying both a writing magnetic field and a current, or by other means.

Magnetic random access memory devices utilizing a spin transfer effect in switching can be operated under a low switching current density, $J_c$, below $10^7$ A/cm$^2$ (e.g., around or below $10^6$ A/cm$^2$) for practical device applications. This low switching current density advantageously allows for formation of densely packed memory cells (e.g., sub-micron lateral dimensions) with a low current. The reduction of spin-transfer switching current density $J_c$ can be critical for making MRAM devices featured by a fast operation speed, low power consumption, and a high spatial density of memory cells.

Figure 2A:
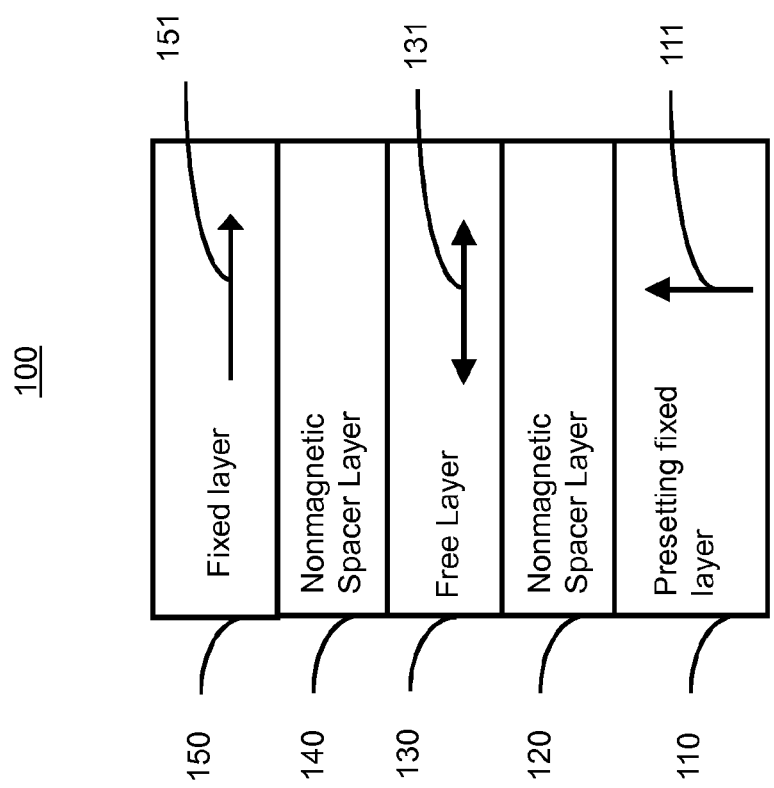
FIG. 2A depicts an example of a portion of a magnetic element having a free magnetic layer, a first pinned magnetic layer, and a pinned presetting layer, where the free layer has an in-plane anisotropy.

FIG. 2a depicts one implementation of a magnetic element 100 having a presetting fixed layer. The magnetic element 100 includes, in order, a presetting fixed layer 110 having a presetting fixed layer magnetization 111, a nonmagnetic spacer layer 120, a free layer 130 with magnetization 131 that can be written using spin transfer, a nonmagnetic spacer layer 140, and a fixed layer 150 having a fixed layer magnetization 151. The presetting fixed layer 110 is provided with out of plane magnetization 111. The fixed layer 150 is provided with in-plane magnetization 151. The free layer 130 is provided with magnetization 131 with in-plane anisotropy.

Presetting fixed layer 110, free layer 130, and/or fixed layer 150 can include magnetic materials multilayered with nonmagnetic or oxide layers, in which the magnetic sublayers can be antiferro-magnetically or ferro-magnetically coupled. Nonmagnetic spacer layer 120 and nonmagnetic spacer layer 140 can include insulating layers such as $Al_2O_3$, MgO, TiO, TaO, and other oxides. Nonmagnetic spacer layer 120 and nonmagnetic spacer layer 140 can include conducting layers such as Cu. An antiferromagnetic layer can be included to pin the magnetization of the presetting fixed layer magnetization 111 in a desired direction after post annealing. An antiferromagnetic layer can be included to pin the magnetization of the fixed layer magnetization 151 in a desired direction after post annealing. A capping layer can be included above fixed layer 150. Also, a seed layer can be included under fixed layer 110.

In some implementations, during operation the magnetization 131 of free layer 130 is preset at an angle away from the easy axis direction with a presetting current utilizing a spin transfer torque, applied through electrodes described below. Before the magnetization 131 of free layer 130 relaxes to be substantially parallel with the in-plane anisotropy easy axis, a write current is applied between free layer 130 and fixed layer 150 to reverse the in-plane direction of magnetization 131 of free layer 130. By presetting the magnetization 131 of free layer 130 partially out of plane with a presetting current, the device may have the advantage of a reduced current density required and faster switching for full magnetization reversal utilizing a spin transfer torque.

Figure 2B:
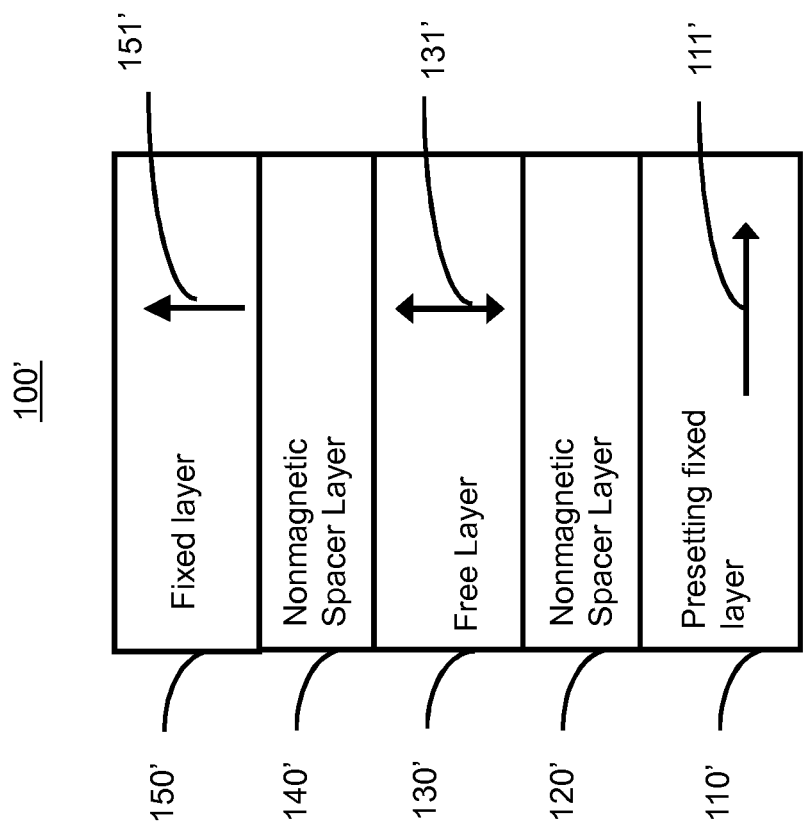
FIG. 2B depicts an example of a portion of a magnetic element having a free magnetic layer, a first pinned magnetic layer, and a pinned presetting layer, where the free magnetic layer has an out of plane anisotropy.

FIG. 2b depicts another implementation of a magnetic element 100' having a presetting fixed layer. The magnetic element 100' includes, in order, a presetting fixed layer 110' having a presetting fixed layer magnetization 111', a nonmagnetic spacer layer 120', a free layer 130' with magnetization 131' that can be written using spin transfer, a nonmagnetic spacer layer 140', and a fixed layer 150' having a fixed layer magnetization 151'. The presetting fixed layer 110' is provided with in-plane magnetization 111'. The fixed layer 150' is provided with out of plane magnetization 151'. The free layer 130' is provided with magnetization 131' with out of plane anisotropy, which is higher than the demagnetizing energy.

Presetting fixed layer 110', free layer 130', and/or fixed layer 150' can include magnetic materials multilayered with nonmagnetic or oxide layers, in which the magnetic sublayers can be antiferro-magnetically or ferro-magnetically coupled. Nonmagnetic spacer layer 120' and nonmagnetic spacer layer 140' can include insulating layers such as $Al_2O_3$, MgO, TiO, TaO, and other oxides. Nonmagnetic spacer layer 120' and nonmagnetic spacer layer 140' can include conducting layers such as Cu. An antiferromagnetic layer can be included to pin the magnetization of the presetting fixed layer magnetization 111' in a desired direction after post annealing. An antiferromagnetic layer can be included to pin the magnetization of the fixed layer magnetization 151' in a desired direction after post annealing. A capping layer can be included above fixed layer 150'. Also, a seed layer can be included under fixed layer 110'.

In some implementations, during operation the magnetization 131' of free layer 130' is preset partially in-plane with a presetting current utilizing a spin transfer torque, applied through electrodes described below. Before the magnetization 131' of free layer 130' relaxes to be substantially parallel with the out of plane anisotropy easy axis, a write current is applied between free layer 130' and fixed layer 150' to reverse the direction of magnetization 131' of free layer 130'. By presetting the magnetization 131' of free layer 130' partially in-plane with a presetting current, the device may have the advantage of a reduced current density required and faster switching for full magnetization reversal utilizing a spin transfer torque.

Figure 3A:
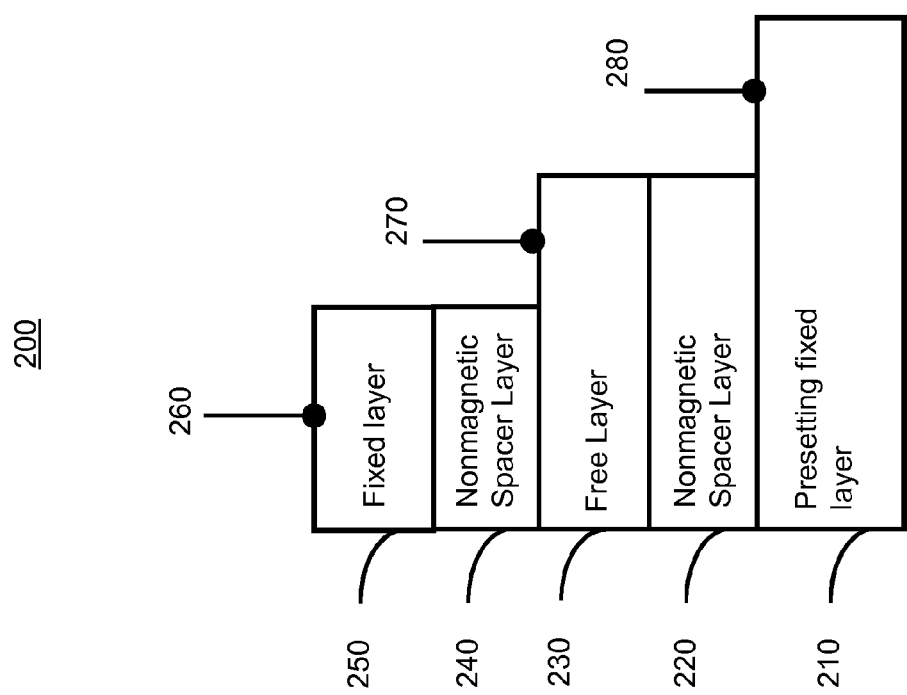
FIGS. 3A and 3C show two examples of a portion of a magnetic element having a free magnetic layer, a first pinned magnetic layer, and a pinned presetting layer.

FIG. 3a depicts an implementation of device 100, a magnetic element 200 having a presetting fixed layer. While FIG. 3a depicts a contacting structure implementing device 100, the contacting structure could also be used to implement device 100'.

The magnetic element 200 includes, in order, a presetting fixed layer 210 having a presetting fixed layer magnetization, a nonmagnetic spacer layer 220, a free layer 230 with magnetization that can be written using spin transfer, a nonmagnetic spacer layer 240, and a fixed layer 250 having a fixed layer magnetization. The presetting fixed layer 210 is provided with out of plane magnetization. The fixed layer 250 is provided with in-plane magnetization. The free layer 230 is provided with magnetization with in-plane anisotropy.

In this implementation, presetting fixed layer 210, free layer 230, and fixed layer 250 are fabricated with different lateral dimensions so as to allow selective electrical contact to each layer. Electrical contacts 280, 270, and 260 are made to presetting fixed layer 210, free layer 230, and fixed layer 250 respectively. In particular, electrical contact 280 can be made to the same side of presetting fixed layer 210 as the nonmagnetic spacer layer 220, electrical contact 270 can be made to the same side of free layer 230 as non-magnetic spacer layer 240, and electrical contact 260 is made to the opposite side of fixed layer 250 from non-magnetic spacer layer 240. Electrical contact 280 can also be made to the opposite side of presetting fixed layer 210 as nonmagnetic spacer layer 220. Although the contacts 260, 270, 280 are illustrated as adjacent, this is not necessary.

Magnetic element 200 can be fabricated using selective deposition and etching techniques. For example, presetting fixed layer is deposited on a substrate, which may include a seed layer, followed by sequential deposition of layers nonmagnetic spacer layer 220, free layer 230, nonmagnetic spacer layer 240, and fixed layer 250. A capping layer may be deposited on fixed layer 250. A mask and etch step is used to selectively remove portions of fixed layer 250 and nonmagnetic spacer layer 240, stopping at free layer 230. A second mask and etch step is used to selectively remove portions of free layer 230 and nonmagnetic spacer layer 220, stopping at presetting fixed layer 210. A dielectric is deposited. A mask, etch, and metallization step is used to selectively expose a portion of presetting fixed layer 210 and deposit a contacting electrode 280. A mask, etch, and metallization step is used to selectively expose a portion of free layer 230 and deposit a contacting electrode 270. Finally, a mask, etch, and metallization step is used to selectively expose a portion of fixed layer 250 and deposit a contacting electrode 260.

Figure 3B:
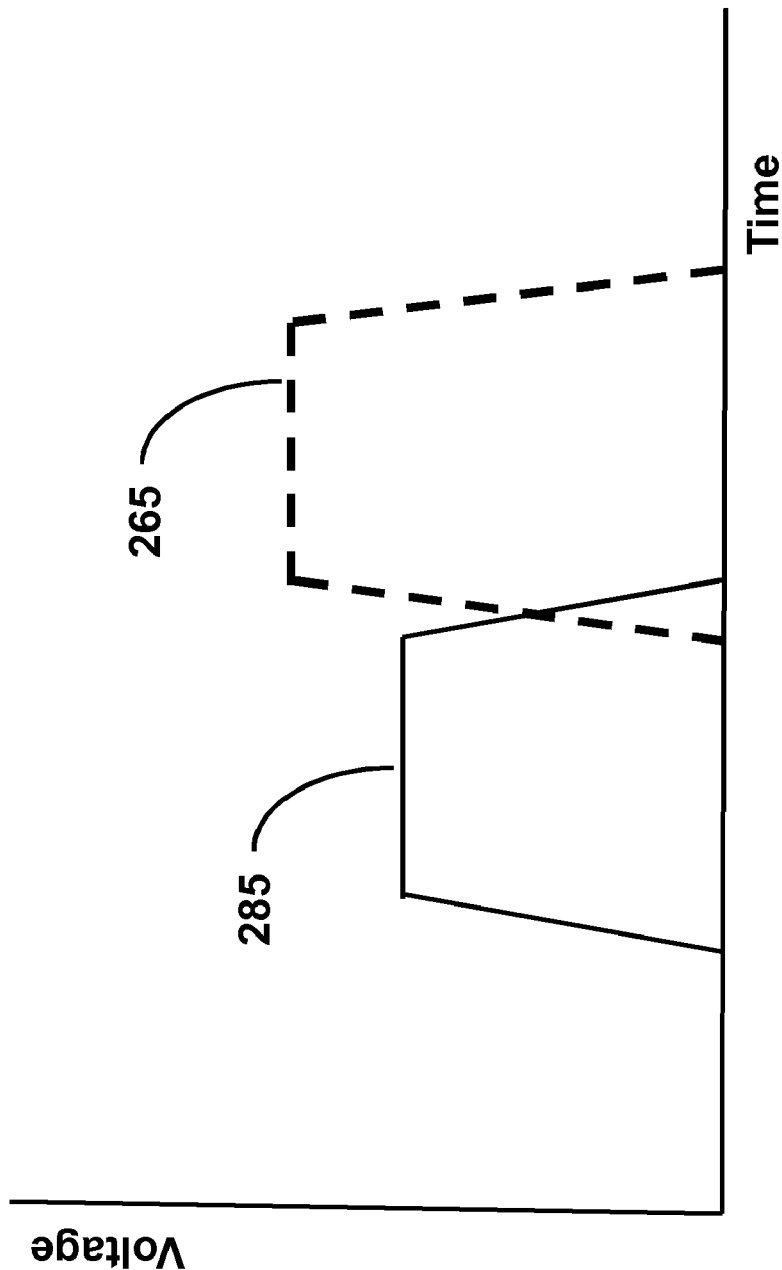
FIGS. 3B and 3D show the application of drive voltage during write operation to magnetic elements having a free magnetic layer, a first pinned magnetic layer, and a pinned presetting layer.

In this implementation, during operation the magnetization of free layer 230 is preset away from its original direction with a presetting current utilizing a spin transfer torque by applying a voltage bias between electrical contacts 270 and 280, shown as voltage pulse 285 in FIG. 3(b). Thus, the presetting current can pass through the presetting fixed layer 210 and free layer 230, but not the fixed layer 250. Before the magnetization of free layer 230 relaxes to be substantially parallel with the in-plane anisotropy easy axis, a write current is applied between free layer 230 and fixed layer 250 to reverse the in-plane direction of magnetization of free layer 230 by applying a voltage bias between electrical contacts 260 and 270, shown as voltage pulse 265 in FIG. 3(b). Thus, the write current can pass through fixed layer 250 and free layer 230, but not the presetting fixed layer 210. The magnitude of the voltage pulse 285 can be less than the magnitude of the voltage pulse 265.

Figure 3C:
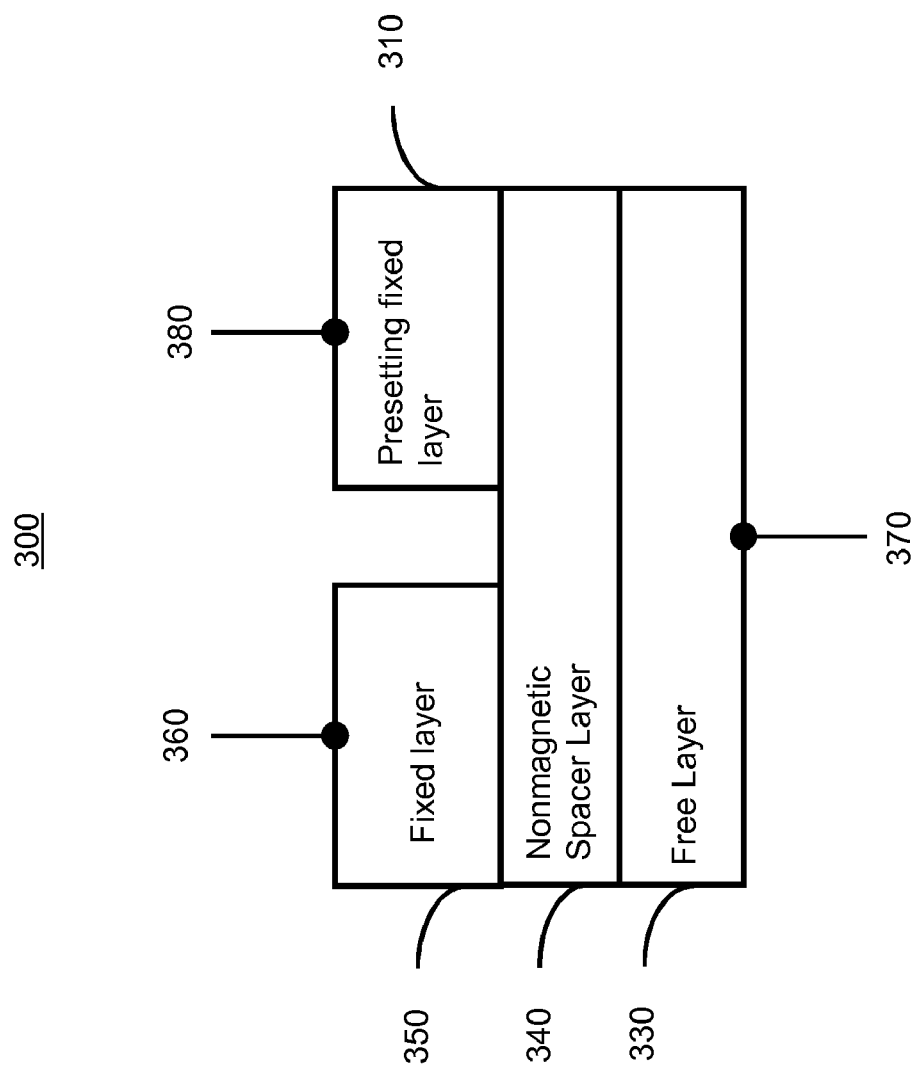

FIG. 3c depicts an implementation of device 100, a magnetic element 300 having a presetting fixed layer. While FIG. 3c depicts a contacting structure implementing device 100, the contacting structure could also be used to implement device 100'.

The magnetic element 300 includes a presetting fixed layer 310 having a presetting fixed layer magnetization, a free layer 330 with magnetization that can be written using spin transfer, a nonmagnetic spacer layer 340, and a fixed layer 350 having a fixed layer magnetization. Fixed layer 350 and presetting fixed layer 310 are adjacent laterally on the nonmagnetic spacer layer 340 (rather than stacked as in FIG. 3a) such that nonmagnetic spacer layer 340 lies between the free layer 330 and fixed layer 350 and also lies between the free layer 330 and presetting fixed layer 310. Fixed layer 350 and presetting fixed layer 310 can be spaced apart laterally, e.g., by a dielectric material. The presetting fixed layer 310 is provided with out of plane magnetization. The fixed layer 350 is provided with in-plane magnetization. The free layer 330 is provided with magnetization with in-plane anisotropy.

In this implementation, presetting fixed layer 310, free layer 330, and fixed layer 350 are fabricated so as to allow selective electrical contact to each layer. Electrical contacts 380, 370, and 360 are made to presetting fixed layer 310, free layer 330, and fixed layer 350 respectively. In particular, electrical contact 380 can be made to the opposite side of presetting fixed layer 310 as the nonmagnetic spacer layer 340, electrical contact 360 is made to the opposite side of fixed layer 350 from nonmagnetic spacer layer 340, and electrical contact 370 can be made to the opposite side of free layer 330 as nonmagnetic spacer layer 340.

Magnetic element 300 can be fabricated using selective deposition and etching techniques. For example, the electrode 370 can be deposited on a substrate, and free layer 330 is deposited on the electrode 370 (a seed layer may be deposited on the electrode before free layer 330), followed by sequential deposition of nonmagnetic spacer layer 340, and fixed layer 350. A capping layer may be deposited on fixed layer 350. A mask and etch step is used to selectively remove portions of fixed layer 350 and nonmagnetic spacer layer 340, and free layer 330. A second mask and etch step is used to selectively remove portions of fixed layer 350, stopping at nonmagnetic spacer layer 340. A mask and metallization step is used to selectively deposit presetting fixed layer 310 over nonmagnetic spacer layer 340, adjacent to fixed layer 350. A dielectric is deposited. A mask, etch, and metallization step is used to selectively expose a portion of presetting fix layer 310 and deposit a contacting electrode 380. A mask, etch, and metallization step is used to selectively expose a portion of fixed layer 350 and deposit a contacting electrode 360. Alternatively, contacts 360 and 380 may be made at the same steps.

Figure 3D:
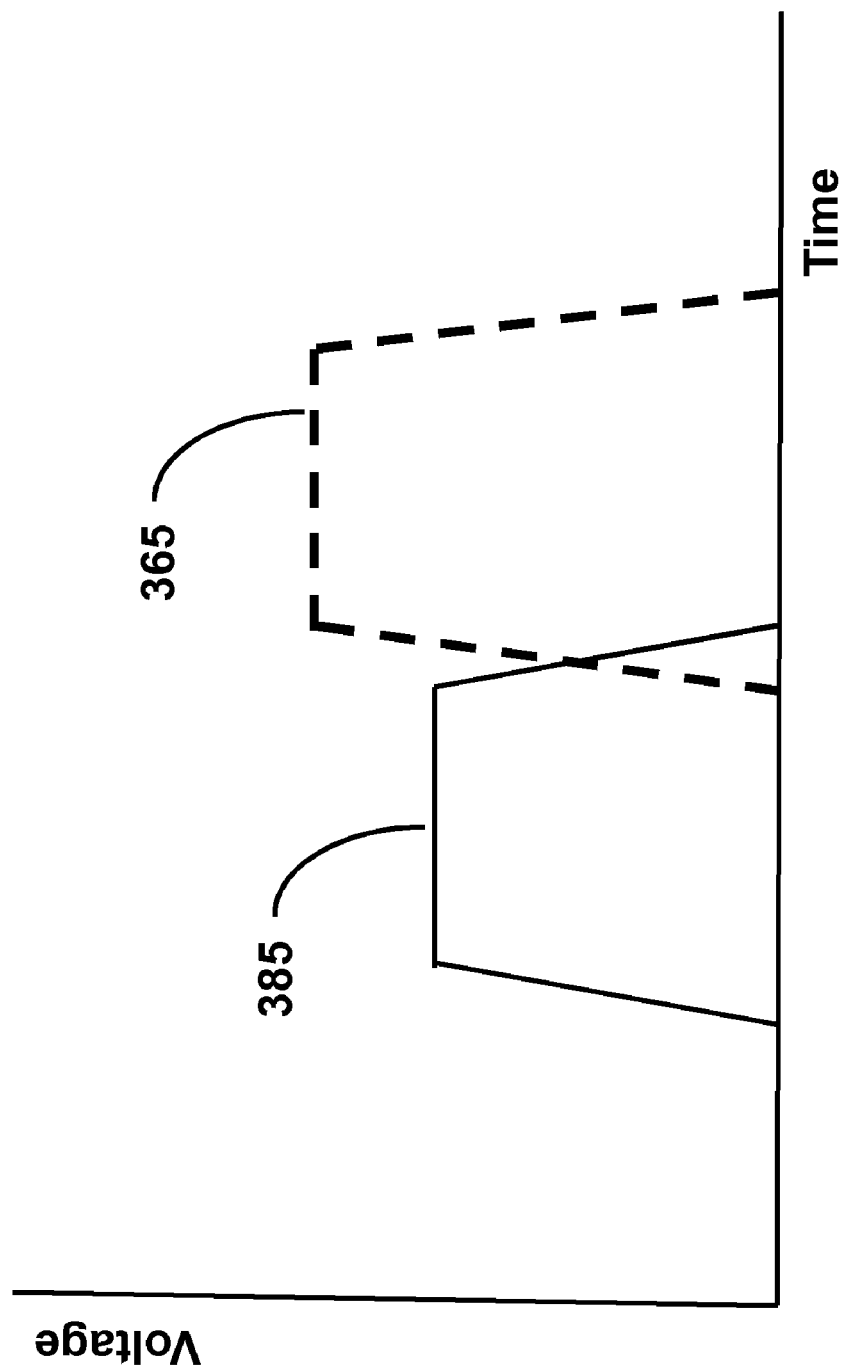

In this implementation, during operation the magnetization of free layer 330 is preset at some angle away from the easy axis direction with a presetting current utilizing a spin transfer torque by applying a voltage bias between electrical contacts 370 and 380, shown as voltage pulse 385 in FIG. 3(d). Thus, the presetting current can pass through the presetting fixed layer 310 and free layer 330, but not the fixed layer 350. Before the magnetization of free layer 330 relaxes to be substantially parallel with the in-plane anisotropy, a write current is applied between free layer 330 and fixed layer 350 to reverse the in-plane direction of magnetization of free layer 330 by applying a voltage bias between electrical contacts 360 and 370, shown as voltage pulse 365 in FIG. 3(d). Thus, the write current can pass through fixed layer 350 and free layer 330, but not the presetting fixed layer 310. The magnitude of the voltage pulse 385 can be less than the magnitude of the voltage pulse 365.

Figure 4:
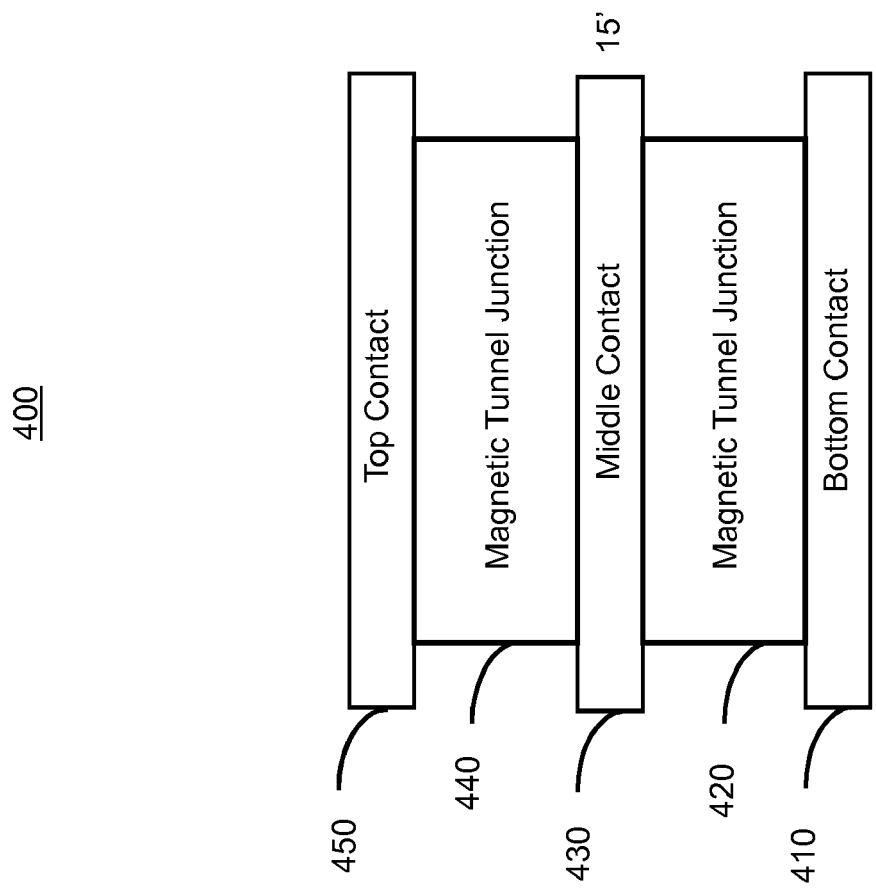
FIG. 4 depicts an example of a portion of a magnetic element having a first magnetic tunnel junction and a second magnetic tunnel junction.

FIG. 4 depicts another implementation of a magnetic element. The magnetic element 400 includes, in order, a bottom contact 410, a first MTJ 420 that can be written using spin transfer, a middle contact 430, a second MTJ 440 that can be written using spin transfer, and a top contact 450. The first MTJ 420 can include a single MTJ, including an insulating layer disposed between a pinned magnetic layer and a free magnetic layer. The first MTJ 420 can include a dual MTJ, including a first pinned magnetic layer, a first insulating layer, a free magnetic layer, a second insulating layer, and a second pinned magnetic layer. An antiferromagnetic layer can be included to pin the magnetization of the fixed layer magnetization(s) of the first MTJ 420. The first MTJ 420 can include a free layer comprising a single magnetic layer or magnetic materials multilayered with nonmagnetic or oxide layers, in which the magnetic sublayers can be antiferro-magnetically or ferro-magnetically coupled. The second MTJ 440 can include a single MTJ, including an insulating layer disposed between a pinned magnetic layer and a free magnetic layer. The first MTJ 440 can include a dual MTJ, including a first pinned magnetic layer, a first insulating layer, a free magnetic layer, a second insulating layer, and a second pinned magnetic layer. An antiferromagnetic layer can be included to pin the magnetization of the fixed layer magnetization(s) of the first MTJ 440. The second MTJ 440 can include a free layer comprising a single magnetic layer or magnetic materials multilayered with nonmagnetic or oxide layers, in which the magnetic sublayers can be antiferro-magnetically or ferro-magnetically coupled.

In this implementation, during operation the state of the first MTJ 420 is set utilizing a spin transfer torque by applying a voltage bias between electrical contacts 410 and 430. In this implementation, during operation the state of the second MTJ 440 is set utilizing a spin transfer torque by applying a voltage bias between electrical contacts 430 and 450. The use of three terminal magnetic elements with a first and second MTJ where each MTJ is individually controllable utilizing a spin transfer torque may allow greater device densities.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A magnetic memory device comprising
a magnetic element including:
 a presetting fixed layer having a fixed layer magnetization fixed in a direction substantially perpendicular to a plane of the presetting fixed layer;

a fixed layer having a fixed layer magnetization fixed in a direction substantially in a plane of the fixed layer;
a free layer between the presetting fixed layer and fixed layer having a free layer magnetization with in-plane anisotropy;
a first nonmagnetic spacer layer between the presetting fixed layer and the free layer; and
a second nonmagnetic spacer layer between the free layer and the fixed layer; and
circuitry configured to apply a presetting current pulse and a write current pulse during a write operation,
wherein:
the presetting current pulse includes a current between the presetting fixed layer and free layer that presets the magnetization of the free layer magnetization at some angle away from an easy axis direction utilizing a spin transfer torque,
the write current pulse includes a current between the free layer and fixed layer that reverses direction of magnetization of the free layer utilizing a spin transfer torque, and
the circuitry is configured to apply the write current pulse sequentially after a beginning of the presetting current pulse and before the magnetization of the free layer relaxes back to be substantially parallel with the anisotropy of the free layer.

2. The magnetic memory device of claim 1 wherein the second nonmagnetic spacer layer is an insulator.

3. The magnetic memory device of claim 1 further comprising:
a first electrical contact to the presetting fixed layer;
a second electrical contact to the free layer;
a third electrical contact to the fixed layer;
wherein the circuitry is configured to provide the presetting pulse between the first electrical contact and second electrical contact and is configured to provide the write pulse between the second electrical contact and third electrical contact.

4. The magnetic memory device of claim 3 wherein the lateral dimensions of the presetting fixed layer, the free layer, and the fixed layer are different.

5. A magnetic memory device comprising
a magnetic element including:
a presetting fixed layer having a fixed layer magnetization fixed in a direction substantially perpendicular to a plane of presetting fixed layer;
a fixed layer having a fixed layer magnetization fixed in a direction substantially in a plane of the fixed layer;
a free layer having a free layer magnetization with in-plane anisotropy;
a nonmagnetic spacer layer between the presetting fixed layer and the free layer and between the fixed layer and the free layer wherein the fixed layer and presetting fixed layer are laterally separated;
and circuitry configured to apply a presetting current pulse and a write current pulse during a write operation, wherein:
the presetting current pulse includes a current between the presetting fixed layer and free layer that presets the magnetization of the free layer magnetization at some angle away from an easy axis direction utilizing a spin transfer torque,
the write current pulse includes a current between the free layer and fixed layer that reverses a direction of the magnetization of the free layer utilizing a spin transfer torque, and the circuitry is configured to apply the write current pulse sequentially after a beginning of the presetting current pulse and before the magnetization of the free layer relaxes back to be substantially parallel with the anisotropy of the free layer.

6. The magnetic memory device of claim 5 wherein the nonmagnetic spacer layer is an insulator.

7. The magnetic memory device of claim 5 further comprising:
a first electrical contact to the presetting fixed layer;
a second electrical contact to the free layer;
a third electrical contact to the fixed layer;
wherein the circuitry is configured to provide the presetting pulse between the first electrical contact and second electrical contact and is configured to provide the write pulse between the second electrical contact and third electrical contact.

8. A magnetic memory device comprising
a magnetic element including:
a presetting fixed layer having a fixed layer magnetization fixed in a direction substantially in a plane of the presetting fixed layer;
a fixed layer having a fixed layer magnetization fixed substantially in a direction perpendicular to a plane of the fixed layer;
a free layer between the presetting fixed layer and fixed layer having a free layer magnetization with an out of plane anisotropy, which overcomes demagnetizing energy;
a first nonmagnetic spacer layer between the presetting fixed layer and the free layer;
a second nonmagnetic spacer layer between the free layer and the fixed layer; and
circuitry configured to apply a presetting current pulse and a write current pulse during a write operation, wherein:
the presetting current pulse includes a current between the presetting fixed layer and free layer that presets the magnetization of the free layer magnetization partially in-plane utilizing a spin transfer torque,
the write current pulse includes a current between the free layer and fixed layer that reverses the direction of the magnetization of the free layer utilizing a spin transfer torque, and
the circuitry is configured to apply the write current pulse sequentially after a beginning of the presetting current pulse and before the magnetization of the free layer relaxes back to be substantially parallel with the anisotropy easy axis of the free layer.

9. The magnetic memory device of claim 8 wherein the second nonmagnetic spacer layer is an insulator.

10. The magnetic memory device of claim 8 further comprising:
a first electrical contact to the presetting fixed layer;
a second electrical contact to the free layer;
a third electrical contact to the fixed layer;
wherein the circuitry is configured to provide the presetting pulse between the first electrical contact and second electrical contact and is configured to provide the write pulse between the second electrical contact and third electrical contact.

11. The magnetic memory device of claim 10 wherein the lateral dimensions of the presetting fixed layer, the free layer, and the fixed layer are different.

12. A magnetic memory device comprising
a magnetic element including:

a presetting fixed layer having a fixed layer magnetization fixed substantially in a direction in a plane of presetting fixed layer;

a fixed layer having a fixed layer magnetization fixed substantially in a direction perpendicular to a plane of the fixed layer;

a free layer having a free layer magnetization with an out of plane anisotropy, which overcomes demagnetizing energy;

a nonmagnetic spacer layer between the presetting fixed layer and the free layer and between the fixed layer and the free layer wherein the fixed layer and presetting fixed layer are laterally separated;

and circuitry configured to apply a presetting current pulse and a write current pulse during a write operation, wherein:

the presetting current pulse includes a current between the presetting fixed layer and free layer to preset the magnetization of the free layer magnetization partially in-plane utilizing a spin transfer torque, the write current pulse includes a current between the free layer and fixed layer that reverses the direction of the magnetization of the free layer utilizing a spin transfer torque, and the circuitry is configured to apply the write current pulse sequentially after a beginning of the presetting current pulse and before the magnetization of the free layer relaxes back to be substantially parallel with the anisotropy easy axis of the free layer.

13. The magnetic memory device of claim 12 wherein the nonmagnetic spacer layer is an insulator.

14. The magnetic memory device of claim 12 further comprising:

a first electrical contact to the presetting fixed layer;

a second electrical contact to the free layer;

a third electrical contact to the fixed layer;

wherein the circuitry is configured to provide the presetting pulse between the first electrical contact and second electrical contact and is configured to provide the write pulse between the second electrical contact and third electrical contact.

\* \* \* \* \*